US009086514B2

(12) United States Patent
Kajiyama et al.

(10) Patent No.: US 9,086,514 B2
(45) Date of Patent: Jul. 21, 2015

(54) SCANNING EXPOSURE APPARATUS USING MICROLENS ARRAY

(75) Inventors: Koichi Kajiyama, Yokohama (JP);
Michinobu Mizumura, Yokohama (JP);
Makoto Hatanaka, Yokohama (JP);
Toshinari Arai, Yokohama (JP)

(73) Assignee: V TECHNOLOGY CO., LTD.,
Yokohama-Shi, Kanagawa (JP)

( * ) Notice: Subject to any disclaimer, the term of this patent is extended or adjusted under 35 U.S.C. 154(b) by 219 days.

(21) Appl. No.: 13/877,653

(22) PCT Filed: Sep. 12, 2011

(86) PCT No.: PCT/JP2011/070735
§ 371 (c)(1),
(2), (4) Date: Apr. 3, 2013

(87) PCT Pub. No.: WO2012/046540
PCT Pub. Date: Apr. 12, 2012

(65) Prior Publication Data
US 2013/0188161 A1    Jul. 25, 2013

(30) Foreign Application Priority Data

Oct. 5, 2010    (JP) .................................. 2010-225971

(51) Int. Cl.
*G03B 3/00*    (2006.01)
*G03F 7/20*    (2006.01)
(Continued)

(52) U.S. Cl.
CPC ............ *G02B 3/0037* (2013.01); *G02B 3/0062* (2013.01); *G02B 26/0875* (2013.01); *G03F 7/70258* (2013.01); *G03F 7/70275* (2013.01)

(58) Field of Classification Search
CPC . G03F 7/201; G03F 7/70258; G03F 7/70275; G03F 7/70358; G02B 26/0875; G02B 3/0037; G02B 3/0062
See application file for complete search history.

(56) References Cited

U.S. PATENT DOCUMENTS 6,133,986 A    10/2000    Johnson
2005/0243295 A1    11/2005    De Jager et al.
(Continued)

FOREIGN PATENT DOCUMENTS

CN    1677240 A    10/2005
JP    09-244255 A    9/1997
(Continued)

OTHER PUBLICATIONS

Chinese Office Action dated Oct. 10, 2014 with a Japanese translation thereof and a partial English translation thereof.
International Search Report in PCT/JP2011/070735 dated Dec. 13, 2011(English Translation Thereof).

*Primary Examiner* — Peter B Kim
*Assistant Examiner* — Michelle Iacoletti
(74) *Attorney, Agent, or Firm* — McGinn IP Law Group, PLLC.

(57) ABSTRACT

A scanning exposure apparatus uses a plurality of microlens arrays to project a mask exposure pattern onto a substrate. A CCD line camera detects an image on the substrate at this time, and using a first-layer pattern on the substrate as a reference pattern, detects whether or not the mask exposure pattern matches the reference pattern. In a case in which the patterns do not match, the microlens array is tilted from a direction that is parallel to the substrate, and the mask exposure pattern is made to match the reference pattern by using the microlens array to adjust the exposure area on the substrate. When the exposure pattern deviates from the reference pattern, it is thereby possible to detect the deviation during exposure and to prevent an exposure pattern misregistration, thereby enhancing the precision of the exposure pattern in an overlay exposure.

6 Claims, 10 Drawing Sheets

(51) Int. Cl.
  *G02B 3/00* (2006.01)
  *G02B 26/08* (2006.01)

(56) References Cited

U.S. PATENT DOCUMENTS

| | | |
|---|---|---|
| 2005/0243298 A1 | 11/2005 | De Jager et al. |
| 2006/0138358 A1 | 6/2006 | Lof et al. |

FOREIGN PATENT DOCUMENTS

| | | |
|---|---|---|
| JP | 2001-500628 A | 1/2001 |
| JP | 2007-003829 A | 1/2007 |
| JP | 2007-052214 A | 3/2007 |
| JP | 2008-292916 A | 12/2008 |
| JP | 2009-055060 A | 3/2009 |
| JP | 2009-111430 A | 5/2009 |
| WO | WO2006/137486 A1 | 12/2006 |

FIG. 5
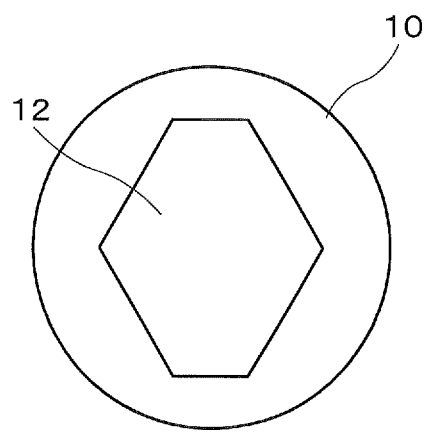
(a)
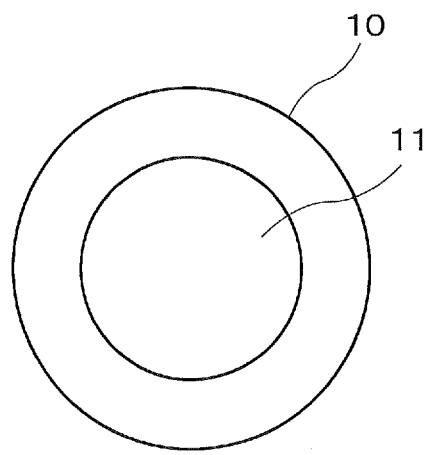
(b)

SCANNING EXPOSURE APPARATUS USING MICROLENS ARRAY

TECHNICAL FIELD

The present invention relates to a scanning exposure apparatus using a microlens array for exposing a mask pattern on a substrate using a microlens array having microlenses arrayed two-dimensionally therein.

BACKGROUND ART

A prescribed pattern is formed on a thin-film transistor liquid crystal substrate and a color filter substrate or the like by subjecting a resist film formed on a glass substrate to overlay exposure a number of times. The substrates to be subjected to exposure may expand and contract during the film-forming process, and the pitch of the lower layer pattern may differ from the design pitch in the overlay exposure due to fabrication conditions (exposure apparatus characteristics and temperature conditions). In an overlay exposure such as this, when a change in the pitch of the exposure position occurs, the pitch change has to be absorbed by controlling magnification on the exposure apparatus side. That is, in a case where the dimensions for the substrate being subjected to exposure have fluctuated, the image must be arranged in the center of a prescribed position on the substrate having the post-fluctuation pitch by adjusting the image magnification to meet the pitch deviation.

Alternatively, a scanning exposure apparatus using a microlens array having microlenses that are arranged two-dimensionally has been proposed recently (Patent Document 1). In this scanning exposure apparatus, a plurality of microlens arrays is arrayed in one direction, and a substrate and a mask are moved relative to the microlens arrays and an exposure light source in a direction perpendicular to the array direction, thereby causing the exposure light to scan the mask and an exposure pattern formed in a hole in the mask to be imaged on the substrate.

PRIOR ART DOCUMENTS

Patent Documents

Patent Document 1: Japanese Patent Application Kokai Publication No. 2007-003829

DISCLOSURE OF THE INVENTION

Problems the Invention is Intended to Solve

However, a conventional scanning exposure apparatus has the following problems. In an exposure apparatus using projection optics that use a combination of normal lenses, it is easy to adjust the magnification by adjusting the lens spacing or the like. However, in the case of microlenses, it is not possible to adjust the magnification since an erect actual-size image is imaged on a substrate by arranging eight lenses in the direction of the optical axis inside a plate-like microlenze array having a thickness, for example, of 4 mm. Consequently, in a scanning exposure apparatus using the microlens array, the problem is that it is not possible to deal with a pitch change in a substrate that is being subjected to exposure.

The present invention was devised with the foregoing problem in view, an object being to provide a scanning exposure apparatus using a microlens array, wherein, even when an exposure pattern deviates from a reference pattern, the exposure apparatus using a microlens array is capable of detecting the deviation during exposure and preventing an exposure pattern misregistration, making it possible to enhance the precision of the exposure pattern in an overlay exposure.

Means for Solving the Problem

A scanning exposure apparatus using a microlens array according to the present invention comprises a plurality of microlens arrays being arranged above a substrate to be subjected to exposure and having microlenses arranged two-dimensionally therein, a support substrate for tiltingly supporting the microlens arrays, a drive member for tiltingly driving each of the microlens arrays relative to the support substrate, a mask arranged above the microlens arrays and having a prescribed exposure pattern formed thereon, an exposure light source for irradiating an exposure light onto the mask, a movement device for relatively moving the microlens arrays, and the substrate and the mask in one direction, an image detector for detecting an image on the substrate, an image processor for performing image processing on the basis of the image detection signal to obtain a reference pattern formed on the substrate, and a controller for calculating a deviation between the reference pattern and an exposure pattern on the mask that is to be subjected to exposure, and for tilting the microlens array by way of the drive member to resolve the deviation between the reference pattern and the exposure pattern, wherein the exposure position on the substrate is adjusted and the exposure pattern is matched to the reference pattern by causing the plurality of microlens arrays to tilt from a direction parallel to the surface of the substrate.

In the scanning exposure apparatus using the microlens array, for example, the image detector is a line sensor for linearly detecting an image, the line sensor being tilted and arranged so that the detection area forms an acute angle with the one direction, and images inside a plurality of rows of microlenses are detected using one line sensor. Or, the image detector is a plurality of line sensors for linearly detecting an image, the plurality of line sensors being arranged in a direction in which the detection area is orthogonal to the one direction, and images inside a plurality of rows of microlenses are detected using all of the plurality of line sensors.

In addition, the microlens, for example, projects an erect actual-size image of the mask exposure pattern onto the substrate.

Effects of the Invention

According to the invention of the present case, in the exposure apparatus using a microlens array, a misregistration between a reference pattern and an exposure pattern can be detected during exposure by detecting the substrate image during exposure and detecting the reference pattern thereof, and the misregistration can be resolved by adjusting the tilt angle of the plurality of microlens arrays. Thus, an exposure misregistration is detected and resolved online in real-time, thereby enabling the dimensional accuracy of an exposure position to be effectively enhanced in an overlay exposure.

BRIEF DESCRIPTION OF THE DRAWINGS

FIGS. 5(a) and 5(b) are views showing stops thereof;

BEST MODE FOR CARRYING OUT THE INVENTION

Figure 1:
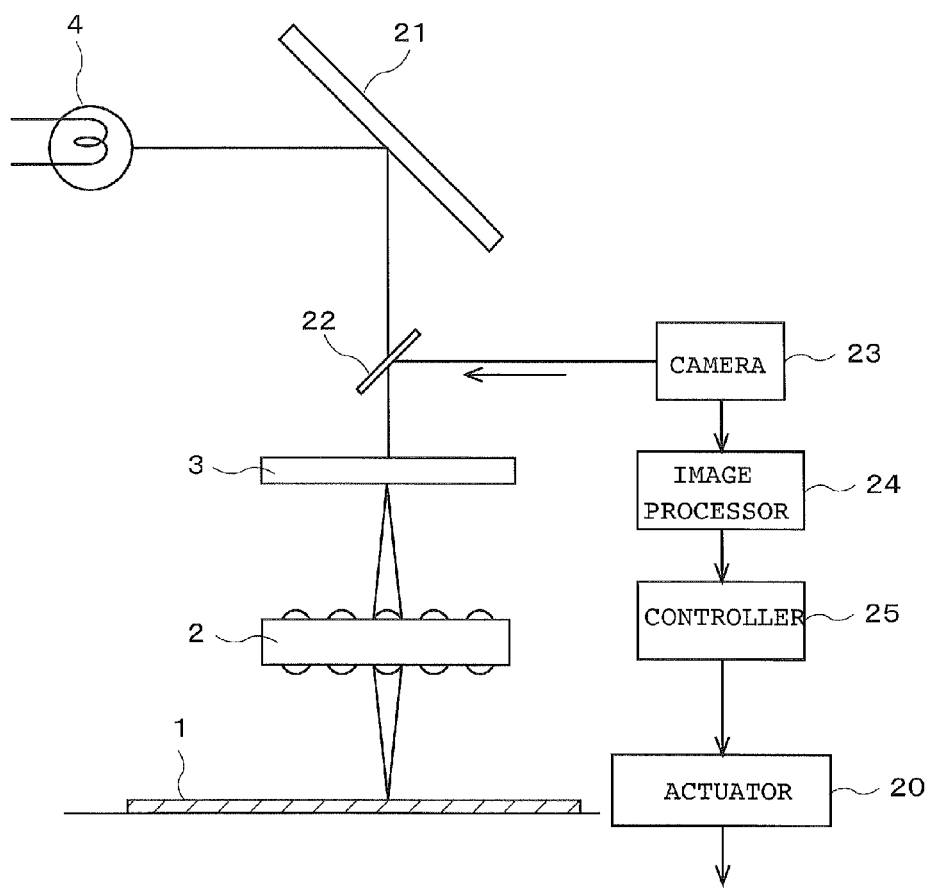
FIG. 1 is a schematic view showing an exposure apparatus according to an embodiment of the present invention.
Figure 2:
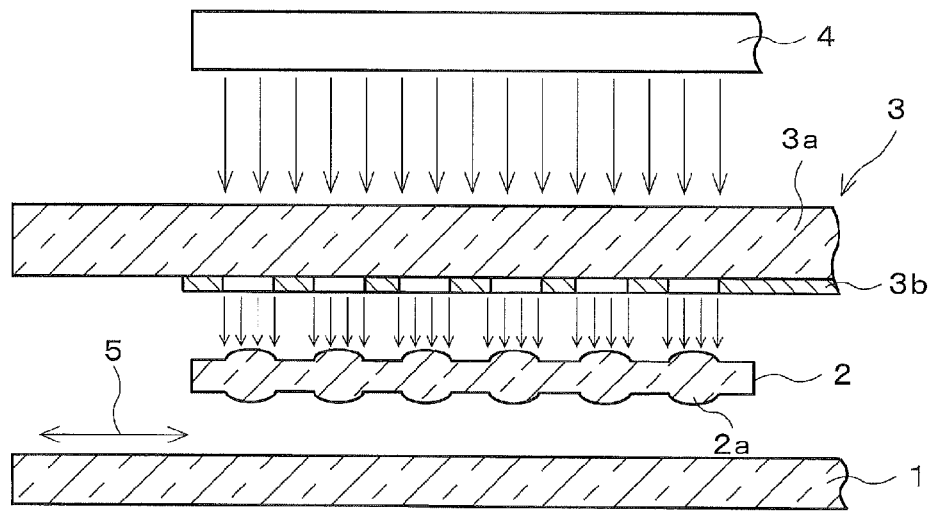
FIG. 2 is a longitudinal cross-sectional view showing a portion of one of the microlens arrays of the exposure apparatus according to an embodiment of the present invention.
Figure 6:
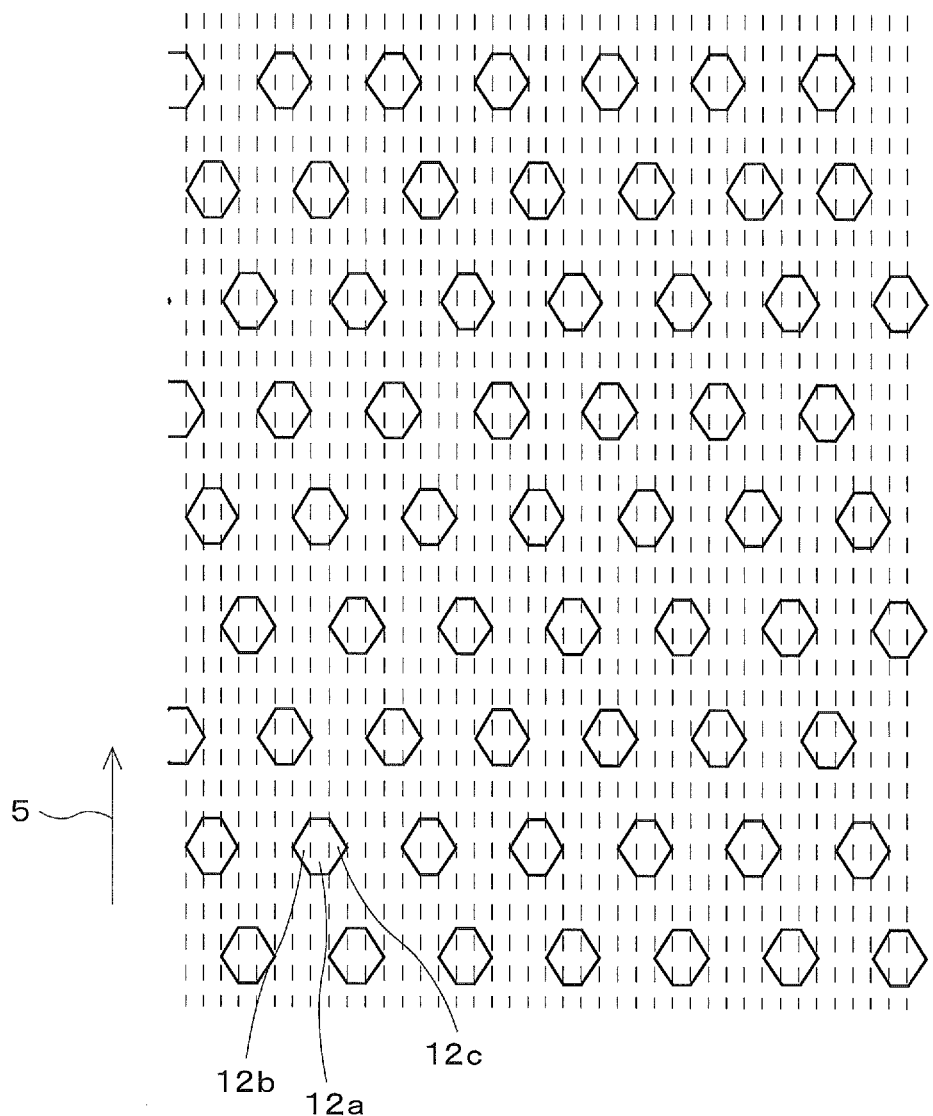
FIG. 6 is a planar view showing an arrangement of microlens hexagonal field stops.
Figure 7:
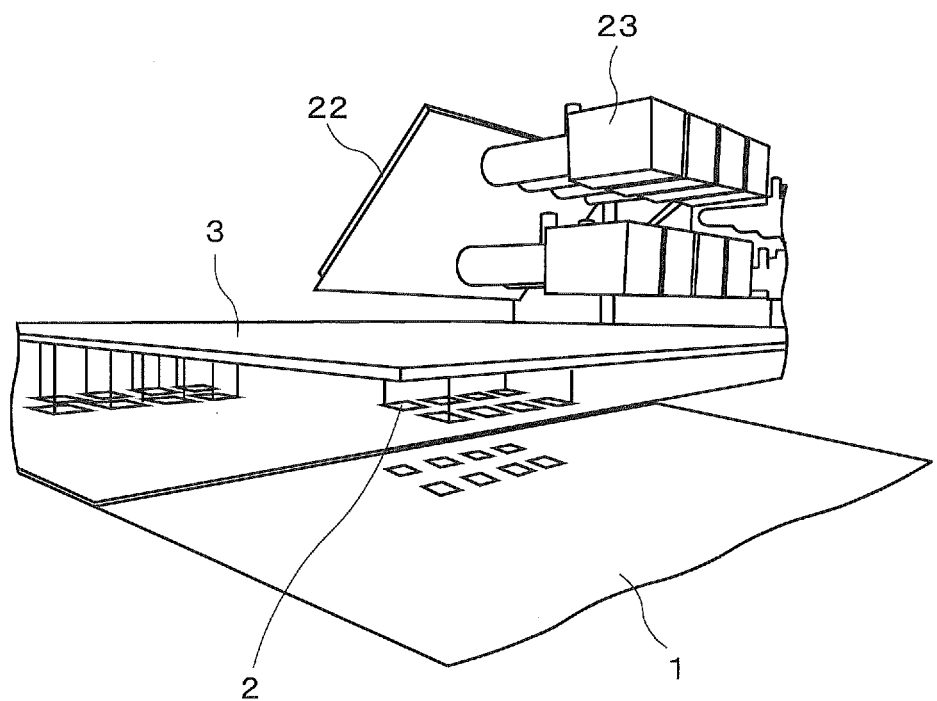
FIG. 7 is a perspective view showing an exposure apparatus according to an embodiment of the present invention.
Figure 8:
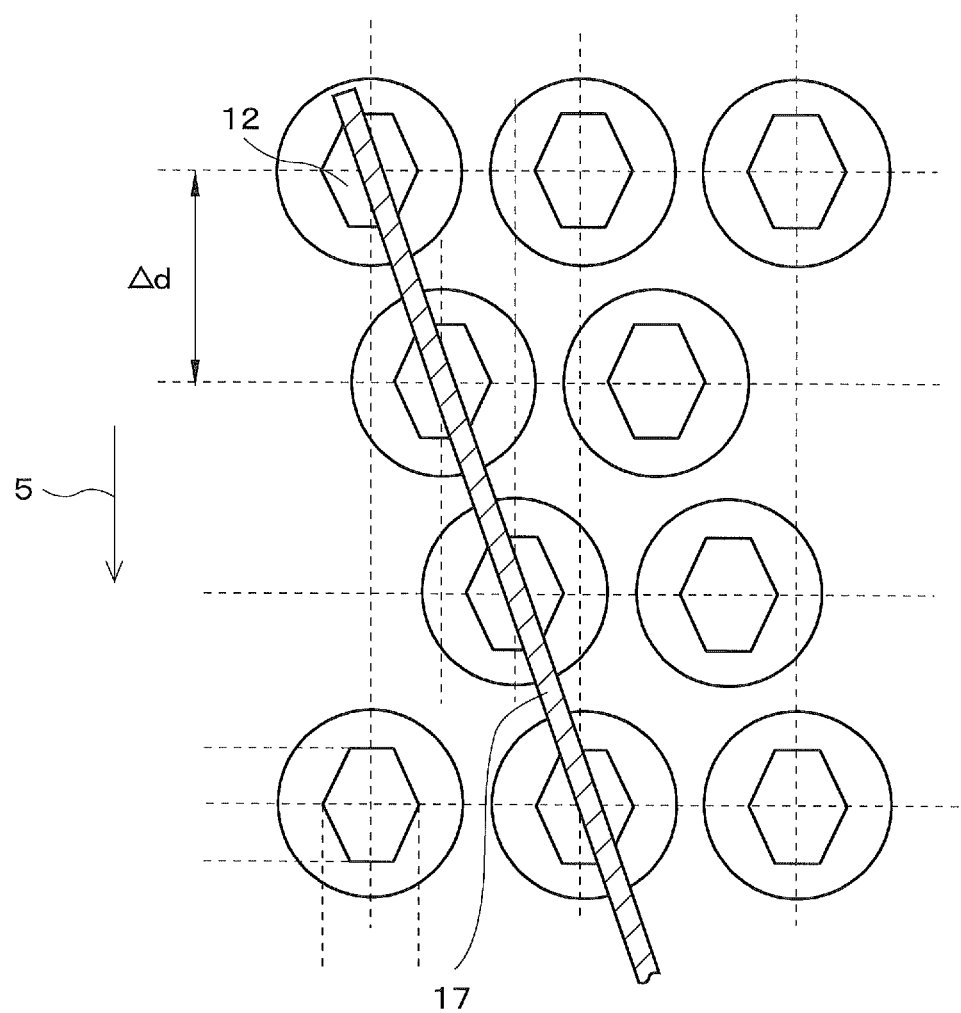
FIG. 8 is a planar view showing a method for detecting an exposure image using a CCD camera.
Figure 9:
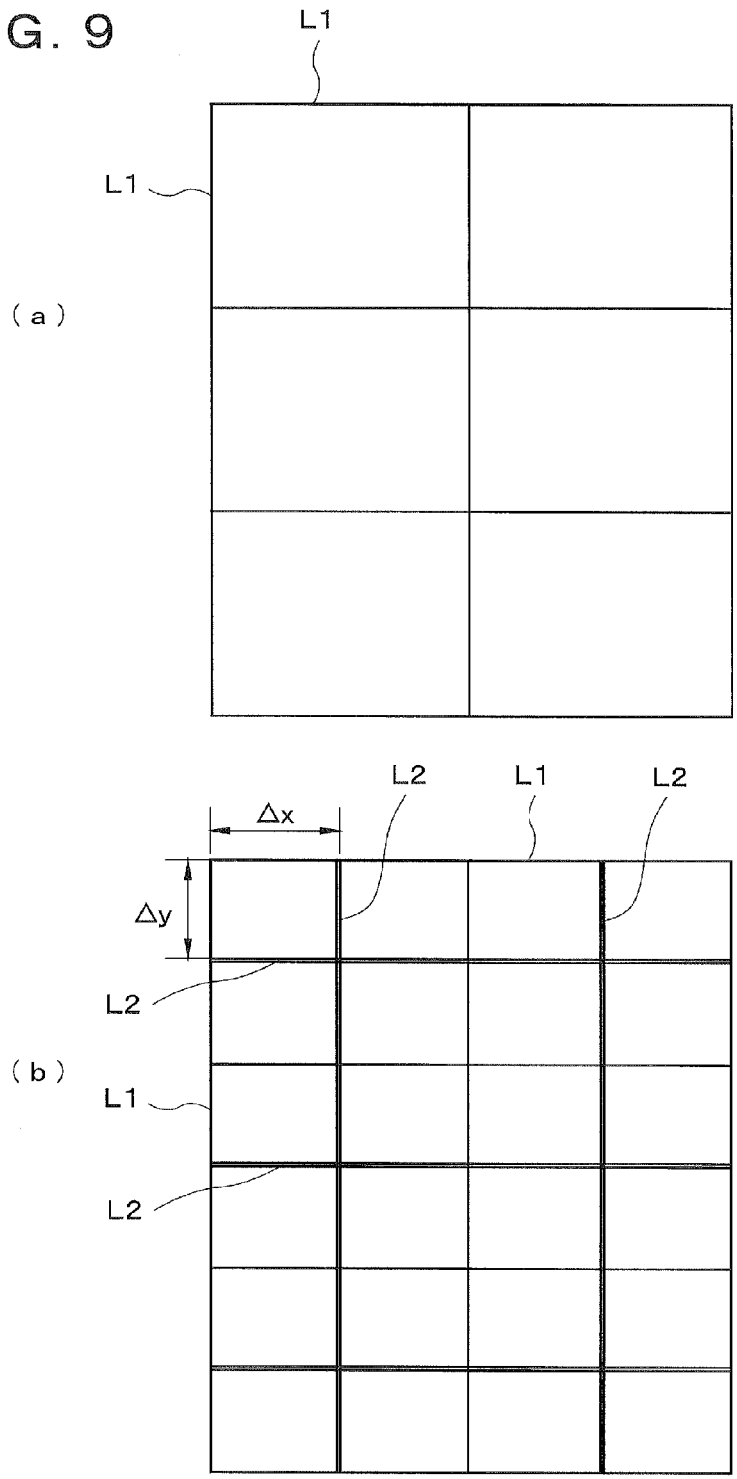
FIGS. 9(a) and 9(b) are views showing exposure patterns.

Embodiments of the present invention will be described in detail hereinbelow with reference to the attached drawings. FIG. 1 is a schematic view showing an exposure apparatus according to an embodiment of the present invention, FIG. 2 is a longitudinal cross-sectional view showing a portion of one of the microlens arrays thereof, FIG. 3 is a perspective view showing a state wherein a plurality of the microlens arrays is arrayed, FIG. 4 is a view showing a microlens, FIGS. 5(a) and 5(b) are views showing stops thereof, FIG. 6 is a planar view showing an arrangement of microlens hexagonal field stops, FIG. 7 is a perspective view showing an exposure apparatus according to an embodiment of the present invention, FIG. 8 is a planar view showing a method for detecting an exposure image using a CCD camera, and FIGS. 9(a) and 9(b) are views showing exposure patterns.

As shown in FIG. 1, an exposure light outputted from an exposure light source 4 is guided to a mask 3 by way of an optical system 21 including a flat mirror, the exposure light transmitted through the mask 3 is irradiated on a microlens array 2, and a pattern formed in the mask 3 is imaged on a substrate 1 using the microlens array 2. A dichroic mirror 22 is arranged in the light path of the optical system 21, an observation light from a camera 23 is reflected by the dichroic mirror 22 toward the mask 3 coaxially with the exposure light from the exposure light source 4. The observation light is made to converge on the substrate 1 by the microlens array 2 and reflect a reference pattern already formed on the substrate 1, and the reflected light of the reference pattern is made incident on the camera 23 by way of the microlens array 2, the mask 3, and the dichroic mirror 22. The camera 23 detects the reflected light of the reference pattern, and outputs a detection signal thereof to an image processor 24. The image processor 24 subjects the reference pattern detection signal to image processing to obtain a reference pattern detection image. A reference pattern image signal obtained by the image processor 24 is inputted to a controller 25, the controller 25 calculates a deviation between the current position of the mask 3 (that is, the position in the mask 3 of the exposure pattern to be subjected to exposure) and the position of the detected reference pattern, and calculates the tilt angle of the microlens array 2 for resolving the deviation. Then, the controller 25 outputs a signal corresponding to the tilt angle of the microlens array 2 to an actuator 20 comprising piezo-electric elements 14, 15 for tiltingly driving the microlens array 2, and the actuator 20 (piezo-electric elements 14, 15) tiltingly drives the microlens array 2 on the basis of this signal. The substrate 1 and the mask 3 can be integrally moved in a fixed direction, and the microlens array 2, the exposure light source 4, and the optical system 21 are fixedly arranged. Then, the exposure light is scanned onto the substrate by moving the substrate 1 and the mask 3 in one direction, and in the case of a so-called one-piece substrate wherein a single substrate for liquid crystal display is fabricated from a glass substrate, the entire substrate for liquid crystal display subjected to exposure using the single scan described hereinabove.

Next, the mode of exposure using the microlens array will be described in more detail. As shown in FIG. 2, the microlens array 2 configured by arranging microlenses 2a two-dimensionally is arranged above a glass substrate or other such substrate to be subjected to exposure, and, in addition, the mask 3 is arranged above the microlens array 2, and the exposure light source 4 is arranged above the mask 3. A light-blocking film comprising a Cr film 3b is formed on the bottom surface of a transparent substrate 3a of the mask 3, and exposure light is transmitted through a hole formed in the Cr film 3b and made to converge on the substrate by the microlens array 2. As described hereinabove, in this embodiment, for example, the microlens array 2 and the exposure light source 4 are fixed, and the substrate 1 and the mask 3 are synchronized and move in the direction of arrow 5, whereby the exposure light from the exposure light source 4 is transmitted through the mask 3 and scanned onto the substrate 1 in the direction of arrow 5. The movement of the substrate 1 and the mask 3 is driven by a drive source in a suitable movement device. Furthermore, the substrate 1 and the mask 3 may be fixed, and the microlens array 2 and the exposure light source 4 may be moved.

Figure 3:
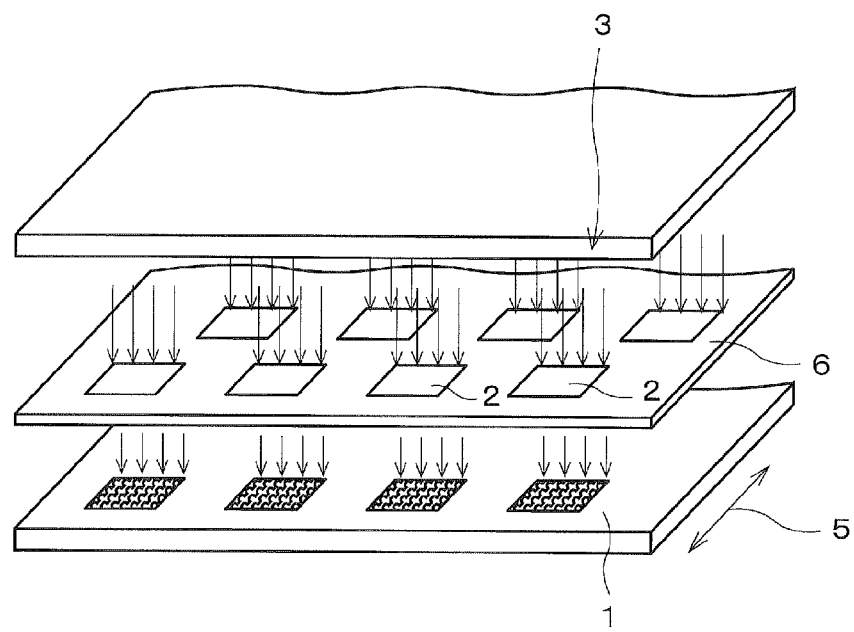
FIG. 3 is a perspective view showing a state wherein a plurality of the microlens arrays is arrayed.
Figure 4:
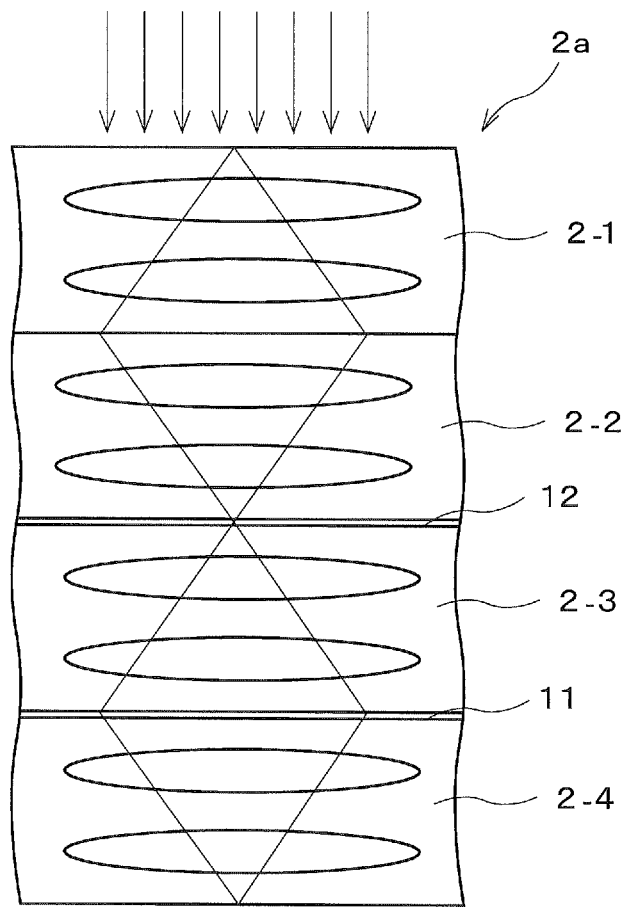
FIG. 4 is a view showing a microlens.

As shown in FIG. 3, the microlens arrays 2 are arranged in a support substrate 6, for example, in two rows of four each in a direction perpendicular to the scanning direction 5, and the microlens arrays 2 are arranged so that the two rows of microlens arrays 2 are staggered with three of the four microlens arrays 2 in the rear being arranged between the four microlens arrays 2 in the front as viewed from the scanning direction 5. In accordance with this, the entire exposure area in the direction perpendicular to the scanning direction 5 is exposed on the substrate 1 using the two rows of microlens arrays 2.

As shown in FIG. 4, each microlens 2a in each microlens array 2, for example, is a four-section, eight-lens configuration, which has a structure wherein four microlens arrays 2-1, 2-2, 2-3, and 2-4 are stacked on top of one another. Each of the microlens arrays 2-1 and so forth comprises two lenses. This allows the exposure light to be made to temporarily converge between the microlens array 2-2 and the microlens array 2-3, and to be imaged on the substrate below the microlens array 2-4. A hexagonal field stop 12 is arranged between the microlens array 2-2 and the microlens array 2-3, and an aperture stop 11 is arranged between the microlens array 2-3 and the microlens array 2-4. The hexagonal field stop 12 and aperture stop 11 are provided in each microlens 2a, and the exposure area on the substrate is formed into a hexagon with respect to each microlens 2a. The hexagonal field stop 12, as shown in FIG. 5(a), for example, is formed as a hexagonal-shaped aperture in the lens field of view 10 area of the microlens 2a, and the aperture stop 11, as shown in FIG. 5(b), is formed as a circular aperture in the lens field of view 10 area of the microlens 2a.

FIG. 6 is a planar view showing a mode of arrangement for individual microlenses 2a in each microlens array 2. FIG. 6 shows the mode of arrangement of the microlens 2a as the position of the hexagonal field stop 12 of the microlens 2a. As shown in FIG. 6, the microlenses 2a are arranged sequentially to deviate slightly in a transverse direction with respect to the scanning direction 5. The hexagonal field stop 12 is divided into a central rectangular portion 12a, and triangular portions 12b and 12c on the two sides as viewed from the scanning direction 5. Then, as shown in FIG. 6, in relation to each row in the direction perpendicular to the scanning direction 5, the microlenses 2a are arranged so that, when three rows of hexagonal field stops 12 are viewed with respect to the scanning direction 5, the triangular portion 12c on the right side of a certain specified first row of hexagonal field stops 12 overlaps with the triangular portion 12b on the left side of the second row of hexagonal field stops 12 that is adjacent in the rearward scan direction, and the triangular portion 12b on the left side of the first row of hexagonal field stops 12 overlaps with the triangular portion 12c on the right side of a third row of hexagonal field stops 12. In so doing, three rows of microlenses 2a are arranged as a single set in relation to the scanning direction 5. That is, a fourth row of microlenses 2a is arranged in the same position as the first row of microlenses 2a in relation to the direction perpendicular to the scanning direction 5. When line segments (shown as broken lines in the drawing) for connecting, in the scanning direction 5, the respective corners of the hexagons forming the hexagonal field stops 12 are at equal intervals of, for example, 0.03 mm at this time, adding the area of the triangular portion 12b and the area of the triangular portion 12c of the hexagonal field stops 12 of two adjacent rows of the three rows of hexagonal field stops 12 results in the total areas of the two triangular portions 12b and 12c that overlap in the scanning direction 5 becoming the same as the area of the central rectangular portion 12a. When the substrate 1 is subjected to a scan of three rows of microlenses 2a, an exposure light of uniform intensity is received over the entire area in relation to the direction perpendicular to the scanning direction 5. Therefore, integral multiples of three rows of microlenses 2a are arranged in each microlens array 2 in relation to the scanning direction 5, resulting in the substrate being subjected to exposure light of uniform intensity over the entire area using a single scan. The line segments (shown as broken lines in the drawing) for connecting, in the scanning direction 5, the respective corners of the hexagons forming the hexagonal field stops 12 do not always have to be at equal intervals. For example, the width of the central rectangular portion 12a of the hexagonal field stop 12 may differ from the height of the triangular portions 12b and 12c. That is, in the two adjacent rows of hexagonal field stops 12 mentioned above, the total area obtained by adding the area of the triangular portion 12b and the area of the triangular portion 12c overlapping in the scanning direction 5 does not have to be the same as the area of the central rectangular portion 12a. In order to be subjected to exposure light of uniform intensity over the entire area, when considering a straight line parallel to the scanning direction 5, it is enough that the total lengths of the straight lines, obtained when the lengths of the portions of the line segments that pass through the inside of the hexagonal field stops 12 have been added together for all the hexagonal field stops on the straight lines, are uniform in relation to the direction perpendicular to the scanning direction 5. In the microlens arrangement shown in FIG. 6, in order to obtain uniform intensity distribution, it is necessary that the rows of microlenses be provided in units of three rows, and that rows having a total of an integral multiple of three microlenses be provided with respect to the scanning direction 5. However, for example, rows of microlenses can also be provided in units of four rows. In this case, the microlenses are arranged so that each of (the right-side triangular portions of the first row and the left-side triangular portions of the second row), (the right-side triangular portions of the second row and the left-side triangular portions of the third row), (the right-side triangular portions of the third row and the left-side triangular portions of the fourth row), and (the right-side triangular portions of the fourth row and the left-side triangular portions of the first row) overlap in the scanning direction 5.

In a microlens array 2 configured in this manner, the substrate 1 is subjected to exposure light of uniform intensity over the entire area targeted for exposure on the substrate 1 in accordance with moving the substrate 1 relative to the microlens array 2 and using the exposure light to scan the substrate while the exposure light from the exposure light source 4 is being irradiated. That is, the substrate 1 is not subjected to spot exposure corresponding to the position of the microlens 2a, but rather the areas between the microlenses 2a of one row are subjected to exposure by the microlenses 2a of another row, and the substrate 1 is subjected to uniform exposure over the entire area targeted for exposure exactly the same as when subjected to planar exposure. The pattern projected onto the substrate 1 is not the shape of the hexagonal field stop 12 and the aperture stop 11 of the microlens 2a, but rather is a pattern determined by a mask pattern (exposure pattern) formed in a hole in the light-blocking film 3b of the mask 3.

Figure 10:
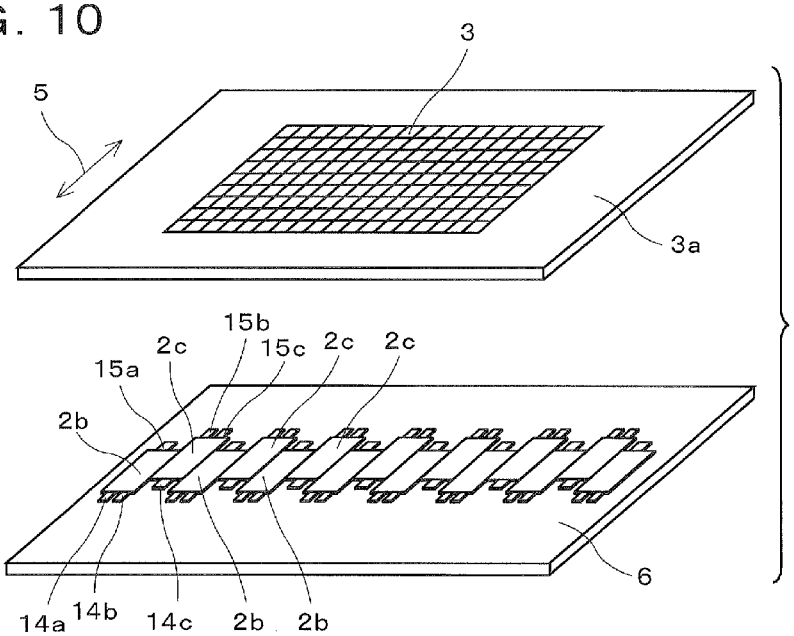
FIG. 10 is a perspective view showing a microlens array tilting operation.
Figure 11:
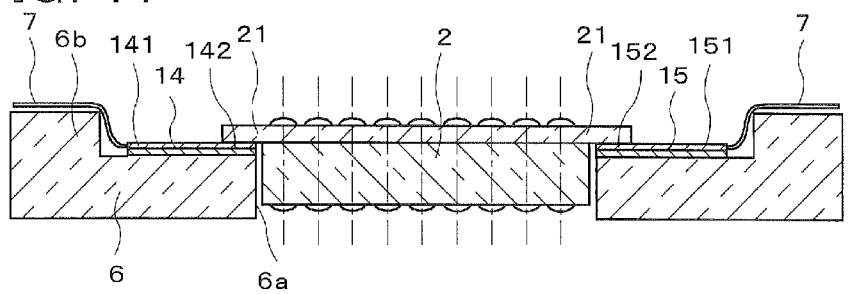
FIG. 11 is a cross-sectional view showing a piezo-electric element, which is an actuator for tilting the microlens array.
Figure 12:
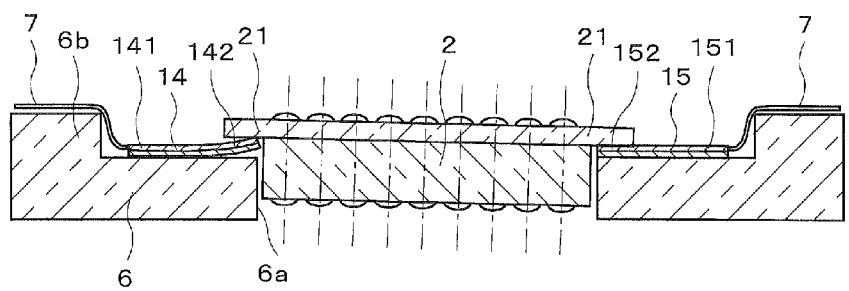
FIG. 12 is a cross-sectional view showing the operation of the piezo-electric element of FIG. 11.

As shown in FIG. 10, the microlens array 2 is arranged on a support substrate 6 by being divided into two rows, i.e. microlens array 2b and microlens array 2c, and the microlens array 2b and microlens array 2c are arranged to form rows in the direction perpendicular to the scanning direction 5 and to deviate from one another in the scanning direction 5. The microlens array 2 is arranged by being fitted into a hole 6a provided in the support substrate 6 as shown in FIG. 11 and FIG. 12, and each hole 6a is sized to correspond to the external shape of each microlens array 2. The microlens arrays 2 are arranged in a row with respect to a direction orthogonal to the scanning direction 5 so that adjacent microlens arrays 2 (microlens array 2b and microlens array 2c) adjoin one another. The portion of the support substrate 6 between the adjacent microlens arrays 2 in the direction orthogonal to the scanning direction 5 is extremely narrow, and a space between the edge of the microlens array 2 in the direction orthogonal to the scanning direction 5 and the microlens 2a arranged near the edge is shortened to less than half of the array pitch of the microlens 2a. Thus, even when the microlens arrays 2 are lined up in rows in the direction orthogonal to the scanning direction 5 as shown in FIG. 10, the spaces between the microlenses 2a of all the microlens arrays 2 in the direction orthogonal to the scanning direction 5 can be made the same. That is, the pitch of the microlenses 2a in the direction orthogonal to the scanning direction 5 is fixed for all the microlens arrays 2. A single microlens array 2 is arranged with respect to the scanning direction 5, and the pitch of the microlenses 2a in this microlens array 2 is fixed.

The microlens arrays 2 can also be arranged in the support substrate 6 to be mutually isolated in both the scanning direction 5 and the direction orthogonal to the scanning direction 5 as shown in FIG. 3. In this case, the microlens arrays 2 can be provided so that the ends thereof overlap when viewed in the scanning direction 5; therefore, the space between the edge and the microlens 2a at the ends of each of the microlens arrays 2 in relation to the direction orthogonal to the scanning direction 5 does not need to be reduced to less than half of the pitch of the microlenses 2a, and the width at the end of each microlens array 2 can be made sufficiently large. Also, the spacing between the holes 6a in the support substrate 6 in the direction orthogonal to the scanning direction 5 can be made sufficiently wide, without having to adopt the narrow-space arrangement shown in FIG. 10. In FIG. 3 and FIG. 10, the microlens arrays 2 are arranged in a staggered state with respect to the direction orthogonal to the scanning direction 5, but in a case where the microlens arrays 2 adjoin one another as shown in FIG. 10, it is also possible to arrange the microlens arrays 2 in a row in a straight line with the scanning direction 5.

In the embodiment shown in FIG. 10, the microlens arrays 2b, for example, have two sides facing in the scanning direction 5, and are supported on the one side by two piezo-electric elements 14a and 14b, and on the other side by one piezo-electric element 15a, and the microlens arrays 2c, for example, have two sides facing in the scanning direction 5, and are supported on the one side by one piezo-electric element 14c, and on the other side by two piezo-electric elements 15b and 15c.

As shown in FIG. 11 and FIG. 12, a hole 6a of a shape that corresponds to the shape of the microlens array 2 is formed in the microlens array 2 allocation position in the support substrate 6 as was described hereinabove, and the microlens array 2 is fitted into the hole 6a. The upper surface of the support substrate 6 around the hole 6a is cut away to form a step 6b, and the piezo-electric elements 14 (14a, 14b, 14c), and 15 (15a, 15b, 15c) are arranged in the low portion of the step 6b, that is, the portion around the hole 6a. A flange part 21 that juts out in the horizontal direction is formed in the upper portion of the microlens array 2, and the flange part 21 is positioned on the step 6b in the portion around the hole 6a in the support substrate 6.

The respective bases 141, 151 of the piezoelectric elements 14, 15 are fixed in the low portion of the step 6b of the support substrate 6, and the ends 142, 152 thereof are fixed to the bottom surface of the flange part 21 of the microlens array 2. The piezo-electric elements 14, 15 are connected to a suitable control device (not shown in the drawing) by leader lines 7, and the piezoelectric elements 14, 15 are supplied with a drive voltage from the control device by way of the leader lines 7, and are made to deform as shown in FIG. 12. That is, in FIG. 11, the piezo-electric elements 14, 15 are not deformed, and as such, the optical axis of the microlens array 2 is directed in the perpendicular direction (perpendicular to the surface of the support substrate 6), but in FIG. 12, the end 142 of the piezo-electric element 14 on the left side of the drawing is deformed upward, and this directs the optical axis of the microlens array 2 in a direction that is tilted relative to the perpendicular direction. By so doing, the direction of the microlens array 2 optical axis can be adjusted by adjusting the voltage applied to the piezo-electric element, and as such, in a case where, hypothetically, there is a misregistration on the substrate between the reference pattern and the exposure pattern, it is possible to detect the misregistration during exposure, and to resolve the misregistration by adjusting the tilt angle of either one or a plurality of microlens arrays. Naturally, the points supported by the piezo-electric elements 14, 15 are not limited to the three points described hereinabove, and four or more points may be provided. In this case, the amount of deformation of the piezo-electric elements at the four or more points must be mutually regulated.

In a microlens array 2 support mechanism configured in this manner, the amount of deformation in the piezo-electric elements 14, 15 can be controlled by controlling the voltage applied to the piezo-electric elements 14, 15, making it possible to tilt the microlens array 2 in an arbitrary direction by adjusting a combination of the amounts of deformation of piezo-electric elements 14, 15 relative to the microlens array 2, which is supported at three points.

The camera 23 is a CCD line camera, and detects an image linearly in one dimension. FIG. 8 is a view showing the arrangement of the microlenses 2a of the microlens array 2, and a detection area 17 of the CCD line camera 23. The hexagonal field stops 12 of the microlenses 2a that are the closest in relation to the scanning direction 5 are not parallel to the scanning direction 5, but rather are tilted as was described hereinabove. The linear detection area 17 of the CCD line camera is arranged tilting relative to the scanning direction 5 so that the detection area 17 coincides with a straight line from the hexagonal field stop 12 of the microlens 2a in the corner part, connecting the hexagonal field stops 12 of the microlenses 2a that are the closest in relation to the scanning direction 5.

When the CCD line camera 23 detects an image on the substrate 1 while the substrate 1 is being moved in the scanning direction 5, the image is detected along the line of the detection area 17 using a single line scan. The detection signal thereof is inputted to the image processor 24 and subjected to image processing. The detection area 17 of the CCD line camera 23, for example, is from the microlens 2a in the corner part of the microlens array 2 to the other end of the microlens array 2 in the width direction. That is, an image of the hexagonal field stops 12 of the microlenses 2a positioned on a tilted line is detected over an entire area in the width direction of the microlens array 2 from the corner part on the one end to the other end in relation to a direction perpendicular to the scanning direction 5. It is supposed that the scanning performance of the CCD line camera at this time is 10 msec per scan, and since the substrate and mask are moving at a rate of, for example, 100 mm/sec, the substrate and mask move 1 mm during the 10 msec scanning time. Therefore, when, subsequent to the CCD line camera 23 at the one end having detected an image of the microlens 2a in the corner part of the microlens array 2, the CCD line camera 23 at the other end has detected an image of the microlens 2a at the other end of the microlens array 2 in the width direction, the image of the microlens 2a at the other end is an image of a position 1 mm rearward of the position of the image of the microlens 2a in the corner part. For example, since the size of the substrate and the mask is 1 m in the width direction, a deviation of 1 mm occurs per meter of substrate. Consequently, a detection image deviation occurs between the adjacent microlenses 2a in the scanning direction proportionate to the quotient obtained by dividing this 1 mm by the number of microlenses 2a.

Regarding the image scanned using the CCD line camera 23, after detecting the image of the microlens 2a in the corner part, the CCD line camera 23 detects the image of the diagonally forward microlens 2a in the substrate scanning direction 5. Thus, the images of the microlenses 2a arranged diagonally forward relative to the substrate scanning direction 5 are sequentially read into the one-dimensional scanned image of the CCD line camera 23. Therefore, when the microlens 2a array pitch in the substrate scanning direction 5 is $\Delta d$, the image signals read in by a single scan by the CCD line camera 23 constitute sequentially read-in images of microlenses 2a forwardly staggered by $\Delta d$ in the substrate scanning direction 5. Consequently, in a case where this lens pitch $\Delta d$ is 150 μm, then, when the substrate rate of movement is 100 mm/sec as was described hereinabove, it takes 1.5 msec to move the substrate the distance of the lens pitch $\Delta d$ (=150 μ=0.15 mm). Therefore, when, subsequent to having detected the image of the microlens 2a in the corner part, the CCD line camera 23 detects the image of the next microlens 2a using a single scan, this next image is the image of a position forward in the substrate scanning direction 5 by $\Delta d$ more than the image of the position adjacent to the image of the microlens 2a in the corner part in the direction perpendicular to the scanning direction. Consequently, an image of the position adjacent to the image of the microlens 2a in the corner part in the direction perpendicular to the scanning direction at a certain point in time is the image detected for this second microlens 2a 1.5 msec later than the point in time at which the image of the microlens 2a subsequent to the microlens 2a in the corner part would have been acquired at this point in time.

When the image processor 24 performs processing for correcting an image in relation to the above two points, i.e., time delay and position adjustment, on the basis of the signal acquired by the CCD line camera 23, an image of a certain prescribed point in time can be obtained while the substrate is being moved. For example, in a case where a first-layer exposure pattern L1 (reference pattern) as shown in FIG. 9(a) is formed on a substrate 1 conveyed to the exposure apparatus of this embodiment, the exposure apparatus scans the stopped substrate 1 at a prescribed position and uses the CCD line camera 23 to detect an image on the substrate 1. When the image processor 24 subjects the detection signal of this reference pattern L1 to image processing, the reference pattern L1 detection image shown in FIG. 9(a) is obtained. The controller 25, on the basis of the image detection signal of this image-processed pattern L1, calculates a deviation between a reference position in the first-layer pattern L1 and a reference position in an exposure pattern L2 formed on the mask 3 and to be subjected to exposure as a second-layer pattern L2, and calculates a tilt angle of the microlens array 2 for resolving this deviation. Then, the controller 25 outputs a signal corresponding to the tilt angle of the microlens array 2 to the actuator 20 comprising the piezo-electric elements 14, 15 for driving the tilting of this microlens array 2, and the actuator 20 (piezo-electric elements 14, 15) tiltingly drives the microlens array on the basis of this signal. That is, the actuator 20 (piezo-electric elements 14, 15), on the basis of the tilt angle for this microlens array 2, adjusts the voltage applied to the piezo-electric elements 14, 15 and drives the microlens array 2 so that the prescribed tilt angle is achieved.

Figure 13:
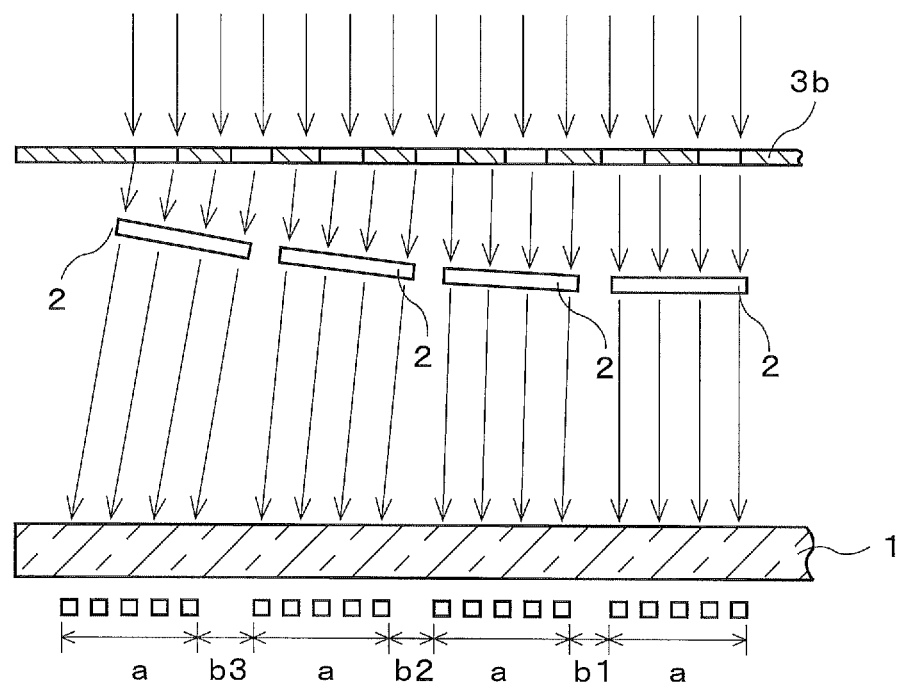
FIG. 13 is a view showing a relationship between microlens array tilting and a mode of exposure.

FIG. 13 is a view showing the relationship between the exposure light and the substrate 1 when the tilt angle of a microlens array 2 has been steadily increased relative to the adjacent microlens array 2. As shown in FIG. 13, when the tilt angle of the microlens array 2 increases, the angle of incidence of the exposure light relative to the substrate 1 gradually becomes smaller than 90° (becomes an acute angle). This results in the exposure area intervals b1, b2, b3 between adjacent microlens arrays 2 becoming gradually larger, and the pattern at the position farthest away from a reference point of the microlens array 2 having the largest tilt angle relative to the pattern at the end (reference point) of the horizontally arranged microlens array 2 becoming more distant from the reference point than the exposure position when all of the microlens arrays 2 are horizontal. Thus, it is possible to adjust the exposure position on the substrate and to increase the exposure area on the substrate by steadily increasing the tilt angles of the microlens arrays 2 lined up in a row. By contrast, the microlens array 2 may be tilted in the opposite direction when reducing the exposure area.

Next, the operation of the exposure apparatus of this embodiment configured as described hereinabove will be described. First, as shown in FIG. 1, a substrate 1 is conveyed to a prescribed exposure position of the exposure apparatus. A pattern L1 such as shown in FIG. 9(a) is exposed on the substrate 1 as a reference pattern. The reference pattern L1 is a first-layer pattern, and using this first-layer pattern as a reference, a second-layer pattern through a fourth-layer pattern are subjected to exposure, and, for example, five layers of patterns are subjected to overlay exposure in the exposure apparatus.

In a case in which a change in dimensions occurs in the fabrication process for a thin-film transistor liquid-crystal substrate and a color filter or other such glass substrate at this time, the exposure pattern will deviate relative to the lower layer pattern in an overlay exposure. Accordingly, scanning is performed with respect to the conveyed substrate 1, the mask 3 therefor, and the microlens array 2, and an image on the substrate 1 is detected using the CCD line camera 23. The light detector of the CCD line camera 23 is a one-dimensional sensor, and as shown in FIG. 8, is installed so as to detect an area that is tilted relative to the substrate scanning direction 5. Thus, the detection area 17 of the CCD line camera 23 is not in a direction perpendicular to the substrate scanning direction 5, but rather is in a direction that is tilted relative to this direction. The reason for this is that, hypothetically, in a case in which a linear detection area 17 is arranged in the direction perpendicular to the substrate scanning direction 5, discrete portions will exist between the hexagonal field stops 12 of adjacent microlenses 2a, thereby making it impossible to detect an image on the substrate 1 in a continuous manner. Accordingly, in this embodiment, the detection area 17 is arranged in a tilting manner to pass through the hexagonal field stops 12 of adjacent microlens arrays 2 closest to the scanning direction 5. This makes it possible to detect an image on the substrate 1 having as a reference the detection image of the microlens 2a in the corner part, which constitutes the reference for the microarray 2a, by using image processing to perform a correction based on a delay time resulting from arranging the detection area 17 in a tilting manner, and a correction resulting from the time delay of the time for one scan by the CCD sensor. That is, the image processor 24 finds the first-layer pattern L1 on the substrate 1 shown in FIG. 9(a) on the basis of the camera 23 detection signal.

In a case in which the first-layer pattern L1 matches a second-layer pattern L2 that has been formed in the mask 3 and is to be subjected to exposure hereinafter, the controller 25 exposes this second-layer pattern L2 on the substrate. That is, the substrate 1 and the mask 3 are integrally moved relative to the microlens array 2 and the light source, and the exposure pattern L2 formed in the mask 3 is subjected to overlay exposure on top of the first-layer pattern L1. This makes it possible to form the second-layer pattern L2 in a position that is isolated from the corner part, which constitutes the reference for the first-layer pattern L1, to the extent of the design values Δx and Δy as shown in FIG. 9(b).

When the exposure light from the exposure light source 4 is incident on the microlens array 2 by way of the mask 3 at this time as shown in FIG. 2 through FIG. 4, an inverted actual-size image is imaged in the hexagonal field stop 12. The exposure light transmitted through each microlens 2a using the hexagonal field stop 12 is formed into a hexagon as shown in FIG. 5(a), and projected onto the substrate 1 as an erect actual-size image. An exposure area is arranged on the substrate at this time using the microlens 2a as shown in FIG. 6.

Then, as shown in FIG. 3, the entire exposure area of the substrate 1 in the direction perpendicular to the scanning direction 5 is subjected to exposure at uniform intensity using eight microlens arrays 2. When the substrate 1 and the mask 3 are scanned in the scanning direction 5 relative to the microlens array 2, the exposure area of the entire surface of the substrate 1 is subjected to exposure at uniform intensity. This allows the mask pattern formed in the mask 3 to be imaged on the substrate 1.

Alternatively, in a case in which the position of the exposure pattern L2 at the current position of the mask 3 has deviated relative to the first-layer pattern L1 detected by the CCD line camera 23, the actuator 20, on the basis of the tilt angle of the microlens array 2 calculated by the controller 25, supplies voltage to the piezo-electric elements 14, 15 and tilts the microlens array 2 to adjust the angle of incidence of the exposure light relative to the substrate 1 so that the reference position of the exposure pattern L2 in the mask 3 matches the reference position of the first-layer pattern L1. For example, when the tilt angles of the four microlens arrays 2 lined up in the direction perpendicular to the substrate scanning direction are steadily increased as shown in FIG. 13, the tilt angle of the exposure light relative to the substrate using the respective microlenses 2a of one microlens array 2 does not change on the substrate 1, but the exposure angle changes between the adjacent microlens arrays 2, and the tilt of the exposure light relative to the substrate becomes increasingly larger the farther to the left the microlens array 2 is in relation to the horizontal microlens array 2 at the right end in FIG. 13.

In accordance with this, the mask pattern (shown as squares in the drawing) of the mask 3 projected onto the substrate 1 from the respective microlens arrays 2 is projected onto an area a for each microlens array 2. In this case, the tilt angle of the exposure light differs for each microlens array 2, but since the tilt angle itself is extremely small, the exposure area a is substantially the same size for each microlens array 2. However, the mask pattern interval b1, b2, b3 between the adjacent microlens arrays 2 becomes gradually larger.

By so doing, the substrate exposure area of the left-end microlens array 2 in FIG. 13 shifts more toward the left side than in a case in which all the microlens arrays 2 are horizontal. This makes it possible to resolve the deviation between the first-layer pattern L1 and the second-layer pattern L2. In a case in which Δx and Δy are 70 μm, tilting the microlens array 2 left-adjacent to the right-end microlens array 2 slightly (about several ¹⁄₁₀₀₀ths) enables the exposure position to be shifted about 1 μm. Therefore, simply tilting the microlens array 2 at an extremely small angle makes it possible to shift a pattern having a 70-μm spacing by 1 μm. Furthermore, the method for tilting the microlens array 2 to resolve a pattern misregistration is not limited to the method shown in FIG. 13; a variety of modes exist.

In this embodiment, even when a change occurs in the dimensions of the substrate in an overlay exposure, this change can be detected in real-time, and the exposure position thereof can be adjusted to the lower layer exposure pattern with a high degree of accuracy. That is, in this embodiment, a misregistration between a lower layer pattern and the exposure pattern in the exposure apparatus during exposure can be corrected by tilting the microlens array, making it possible to correct the misregistration in real-time and to perform overlay exposure with a high degree of accuracy.

Various types of light, such as pulsed laser radiation or a mercury lamp or other such continuous light can be used as the exposure light. In addition, this embodiment uses a CCD line camera 23 comprising a light irradiation unit for irradiating a light onto the substrate, and a CCD line sensor for detecting a reflected light, and uses a dichroic mirror 22 to irradiate an observation light from the camera 23 onto the substrate, but a light may be irradiated from below the substrate and the first-layer exposure pattern formed on the substrate may be detected by inputting the image thereof into the CCD line sensor. In addition, the detection of an image on the substrate is not limited to a case that uses a CCD line sensor; an image on the substrate can also be detected using a two-dimensional sensor.

As shall be apparent, the present invention is not limited to the embodiment described hereinabove. For example, in the above-described embodiment, as shown in FIG. 8, image processing is performed by arranging the line sensor of the CCD line camera 23 so that the detection area 17 thereof is tilted relative to the scanning direction 5, thereby detecting the images inside contiguous hexagonal field stops 12 without interruption over an entire area in the direction perpendicular to the scanning direction 5.

However, the images inside the contiguous hexagonal field stops 12 can similarly be detected without interruption over an entire area in the direction perpendicular to the scanning direction 5 by arranging the line sensor in the direction perpendicular to the scanning direction 5 and providing three rows of these line sensors.

INDUSTRIAL APPLICABILITY

In the present invention, a plurality of microlens arrays is used to project erect actual-size images of a mask exposure pattern onto a substrate, and the image magnification can be adjusted when the mask exposure pattern is projected onto the substrate by adjusting the tilt angle of the microlens arrays. It is also possible to resolve a misregistration between the mask exposure pattern and the reference pattern on the substrate by adjusting the tilt angle of the microlens array. Thus, the present invention can expand the applications of scanning exposure apparatuses that make use of microlens arrays, thereby achieving high industrial utility value.

Key
1: Substrate
2: Microlens array
2a: Microlens
2-1, 2-2, 2-3, 2-4: Microlens arrays (configuration)
3: Mask
3a: Transparent substrate
3b: Cr film
4: Exposure light source
5: Scanning direction
6: Support substrate
11: Aperture stop
12: Hexagonal field stop
12a: Rectangular portion
12b, 12c: Triangular portions
14 (14a, 14b, 14c), 15 (15a, 15b, 15c): Piezo-electric elements
17: Detection area
20: Actuator
21: Optical system
22: Dichroic mirror
23: CCD line camera
24: Image processor
25: Controller

What is claimed is:
1. A scanning exposure apparatus using a microlens array, the scanning exposure apparatus comprising:
a plurality of microlens arrays being arranged above a substrate to be subjected to exposure and including microlenses arranged two-dimensionally therein;
a support substrate for tilt supporting the microlens arrays;
a drive member for tilt driving each of said microlens arrays relative to said support substrate such that said microlens arrays are capable of being tilted relative to the support substrate;
a mask arranged above the microlens arrays and having a prescribed exposure pattern formed thereon;

an exposure light source for irradiating an exposure light onto the mask;

a movement device for relatively moving said microlens arrays, said substrate, and said mask in one direction;

an image detector for detecting an image on said substrate;

an image processor for performing an image processing on a basis of the image detection signal to obtain a reference pattern formed on the substrate; and a controller configured to calculate a deviation between the reference pattern and an exposure pattern on said mask that is to be subjected to exposure, and to tilt said microlens arrays by way of said drive member to resolve the deviation between said reference pattern and said exposure pattern, wherein the exposure position on the substrate is adjusted and the exposure pattern is matched to said reference pattern by causing said plurality of microlens arrays to tilt from a direction parallel to a surface of the substrate.

2. A scanning exposure apparatus using the microlens array according to claim 1, wherein said image detector comprises a line sensor for linearly detecting an image, the line sensor being tilted so that a detection area thereof forms an acute angle relative to said one direction.

3. A scanning exposure apparatus using the microlens array according to claim 2, wherein said microlens projects onto said substrate an erect actual-size image of the exposure pattern of said mask.

4. A scanning exposure apparatus using the microlens array according to claim 1, wherein said image detector comprises a plurality of line sensors for linearly detecting an image, the detection area of the plurality of line sensors being arranged in a direction orthogonal to said one direction.

5. A scanning exposure apparatus using the microlens array according to claim 4, wherein said microlens projects onto said substrate an erect actual-size image of the exposure pattern of said mask.

6. A scanning exposure apparatus using the microlens array according to claim 1, wherein said microlens projects onto said substrate an erect actual-size image of the exposure pattern of said mask.

* * * * *